(12) United States Patent
Cheng et al.

(10) Patent No.: US 9,368,492 B2
(45) Date of Patent: Jun. 14, 2016

(54) FORMING FINS OF DIFFERENT MATERIALS ON THE SAME SUBSTRATE

(71) Applicant: GLOBALFOUNDRIES INC., Grand Cayman (KY)

(72) Inventors: Kangguo Cheng, Schenectady, NY (US); Ali Khakifirooz, Mountain View, CA (US); Alexander Reznicek, Troy, NY (US); Dominic J. Schepis, Wappingers Falls, NY (US)

(73) Assignee: GLOBALFOUNDRIES, Grand Cayman (KY)

( * ) Notice: Subject to any disclaimer, the term of this patent is extended or adjusted under 35 U.S.C. 154(b) by 288 days.

(21) Appl. No.: 14/054,009

(22) Filed: Oct. 15, 2013

(65) Prior Publication Data
US 2015/0102454 A1    Apr. 16, 2015

(51) Int. Cl.
*H01L 21/82* (2006.01)
*H01L 27/088* (2006.01)
*H01L 29/66* (2006.01)
*H01L 21/02* (2006.01)
*H01L 29/78* (2006.01)
*H01L 21/84* (2006.01)
*H01L 27/12* (2006.01)
H01L 21/8234 (2006.01)

(52) U.S. Cl.
CPC ...... *H01L 27/0886* (2013.01); *H01L 21/02123* (2013.01); *H01L 21/845* (2013.01); *H01L 27/1211* (2013.01); *H01L 29/66795* (2013.01); *H01L 29/7856* (2013.01); *H01L 21/823431* (2013.01); *H01L 21/823481* (2013.01)

(58) Field of Classification Search
CPC .............. H01L 29/66795; H01L 21/823431; H01L 29/7856; H01L 21/02123
USPC .......................................... 438/283; 257/506
See application file for complete search history.

(56) References Cited

U.S. PATENT DOCUMENTS

| | | |
|---|---|---|
| 7,781,800 B2 | 8/2010 | Chen et al. |
| 2007/0221956 A1 | 9/2007 | Inaba |
| 2007/0235759 A1 | 10/2007 | Henson et al. |
| 2008/0227241 A1 | 9/2008 | Nakabayashi et al. |
| 2011/0165738 A1 | 7/2011 | Tezuka et al. |
| 2012/0104498 A1 | 5/2012 | Majumdar et al. |
| 2012/0276695 A1 | 11/2012 | Cheng et al. |
| 2012/0276712 A1 | 11/2012 | Ikeda et al. |

OTHER PUBLICATIONS

Authors et al.: Disclosed Anonymously,: "Method and System for Fabricating a High-k/metal Gate finFET CMOS by Simultaneously Forming Si-nFET and SiGe-pFET on a Semiconductor Substrate"., IPCOM000217323D, May 7, 2012, pp. 1-5.
Cheng et al.,"Extremely Thin SOI (ETSOI) CMOS with Record Low Variability for Low Power System-on-Chip Applications"., 2009 IEEE, IEDM09-49, pp. 1-4.

*Primary Examiner* — Howard Weiss
*Assistant Examiner* — Tifney Skyles
(74) *Attorney, Agent, or Firm* — Scully Scott Murphy and Presser; Frank Digiglio

(57) ABSTRACT

A semiconductor substrate may be formed by providing an providing a semiconductor-on-insulator (SOI) substrate including a base semiconductor layer, a buried insulator layer above the base semiconductor layer, and a SOI layer comprising a first semiconductor material above the buried insulator layer; forming an isolation region in the SOI layer isolating a first portion of the SOI layer from a second portion of the SOI layer; removing the second portion of the SOI layer to expose a portion of the buried insulator layer; forming a hole in the exposed portion of the buried insulator layer to expose a portion of the base semiconductor layer; and forming a semiconductor layer made of a second semiconductor material on the exposed portion of the base semiconductor layer, so that the replacement semiconductor layer covers the exposed region of the buried insulator layer.

8 Claims, 4 Drawing Sheets

FORMING FINS OF DIFFERENT MATERIALS ON THE SAME SUBSTRATE

BACKGROUND

The present invention relates to semiconductor devices, and particularly to methods of forming fins of two different semiconductor materials on the same substrate.

Fin field effect transistors (FinFETs) are an emerging technology which may provide solutions to field effect transistor (FET) scaling problems at, and below, the 22 nm node. FinFET structures may include at least a narrow semiconductor fin gated on at least two sides of each of the semiconductor fin, as well as a source region and a drain region adjacent to the fin on opposite sides of the gate. FinFET structures having n-type source and drain regions may be referred to as nFinFETs, and FinFET structures having p-type source and drain regions may be referred to as pFinFETs.

In some FinFET structures, different materials may be used for the fins of pFinFETs and nFinFETs in order to improve device performance. However, a material that may improve pFinFET performance may reduce nFET performance, and vice versa. For example, while pFinFET performance may be improved by forming fins made of silicon-germanium, nFinFET performance may instead be improved by forming fins made of carbon-doped silicon and may be degraded by forming fins made of silicon-germanium. Further, pFinFETs and nFinFETs are often fabricated on the same substrate.

SUMMARY

An embodiment of the invention may include a method of forming a semiconductor substrate by providing an providing a semiconductor-on-insulator (SOI) substrate including a base semiconductor layer, a buried insulator layer above the base semiconductor layer, and a SOI layer comprising a first semiconductor material above the buried insulator layer; forming an isolation region in the SOI layer isolating a first portion of the SOI layer from a second portion of the SOI layer; removing the second portion of the SOI layer to expose a portion of the buried insulator layer; forming a hole in the exposed portion of the buried insulator layer to expose a portion of the base semiconductor layer; and forming a semiconductor layer made of a second semiconductor material on the exposed portion of the base semiconductor layer, so that the replacement semiconductor layer covers the exposed region of the buried insulator layer. In some embodiments, the first semiconductor material may be different from the second semiconductor material. Methods may further include etching the first portion of the SOI layer to form a first fin made of the first semiconductor material and etching the semiconductor layer to form a second fin made of the second semiconductor material.

In another embodiment of the invention, a semiconductor substrate may include a base substrate layer; a buried a buried insulator layer above the base substrate layer; a first semiconductor layer above the buried insulator layer; and a second semiconductor layer above the buried insulator layer that contacts the base layer through a hole in the buried insulator layer.

In another embodiment of the invention, a semiconductor structure may include a base substrate layer; a buried insulator layer above the base substrate layer; a first plurality of semiconductor fins on the buried insulator layer; and a second plurality of semiconductor fins on the buried insulator layer, at least one of which contacts the base substrate through a hole in the buried insulator layer.

Figure 1:
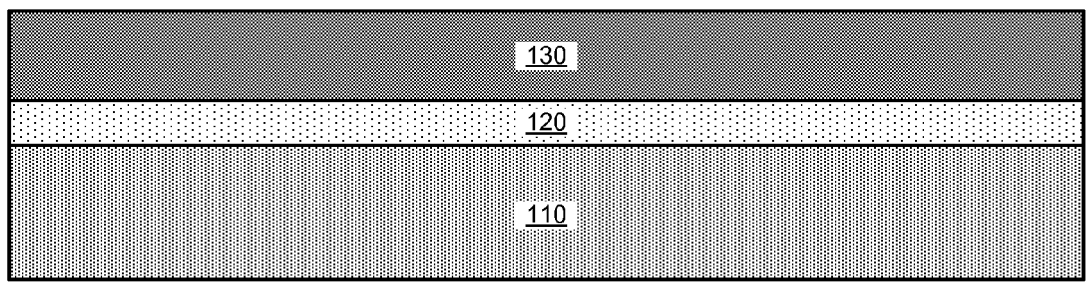
FIG. 1 is a side view depicting a semiconductor-on-insulator (SOI) substrate, according to an embodiment of the present invention.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments Embodiments may include methods of preparing a semiconductor substrate so that a semiconductor-on-insulator (SOI) substrate has a top layer made of two different semiconductor regions. The method may include forming a isolation region in the SOI layer of the SOI substrate to divide the SOI layer into a first portion and a second portion (FIG. 2), removing the second portion of the SOI layer (FIG. 4), etching a hole in the buried insulator layer beneath the removed second portion of the SOI layer to exposed the base substrate (FIG. 5), and growing a semiconductor region on the base substrate to replace the second portion of the SOI layer (FIG. 6). By forming the semiconductor region of a different material than the SOI layer, the SOI substrate may then have a top layer formed by both a first semiconductor material on one side of the isolation region and a second semiconductor material on the other side of the isolation region. The SOI substrate may then be used to fabricate any number of microelectronic devices where such a dual-material substrate would be desirable. For example, a finFET device may be fabricated including both nFETs and pFETs, where the nFETs have silicon fins and the pFETs have silicon-germanium fins.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Referring to FIG. 1, a SOI substrate 100 may include a base semiconductor layer 110, a buried insulator layer 120, and an SOI layer 130. The buried insulator layer 120 may isolate the SOI layer 130 from the base semiconductor layer 110. The base semiconductor layer 110 may be made from any of several known semiconductor materials such as, for example, silicon, germanium, silicon-germanium alloy, carbon-doped silicon, carbon-doped silicon-germanium alloy, and compound (e.g. III-V and II-VI) semiconductor materials. Non-limiting examples of compound semiconductor materials include gallium arsenide, indium arsenide, and indium phosphide. In a preferred embodiment, the base semiconductor layer 110 may include silicon, silicon-germanium, or carbon-doped silicon. Typically the base layer 110 may be approximately, but is not limited to, several hundred microns thick. For example, the base layer 110 may have a thickness ranging from approximately 0.5 mm to approximately 1.5 mm.

The buried insulator layer 120 may be formed from any of several dielectric materials. Non-limiting examples include, for example, oxides, nitrides, oxynitrides of silicon, and combinations thereof. Oxides, nitrides and oxynitrides of other elements are also envisioned. In addition, the buried insulator layer 120 may include crystalline or non-crystalline dielectric material. The buried insulator layer 120 may be 100-500 nm thick, preferably about 200 nm.

The SOI layer 130 may be made of any of the several semiconductor materials possible for the base layer 110. In general, the base layer 110 and the SOI substrate layer 130 may include either identical or different semiconducting materials with respect to chemical composition, dopant concentration and crystallographic orientation. In a preferred embodiment, the SOI layer 130 comprises silicon, silicon-germanium, or carbon-doped silicon. The SOI layer 130 may be doped with p-type dopants, such as boron, or doped with n-type dopants, such as phosphorus and/or arsenic. The dopant concentration may range from approximately $1\times10^{15}$ $cm^{-3}$ to approximately $1\times10^{19}$ $cm^{-3}$, preferably approximately $1\times10^{15}$ $cm^{-3}$ to approximately $1\times10^{16}$ $cm^{-3}$. In one embodiment, the SOI layer is undoped. The SOI layer 130 may have a thickness ranging from approximately 5 nm to approximately 300 nm, preferably approximately 30 nm.

Figure 2:
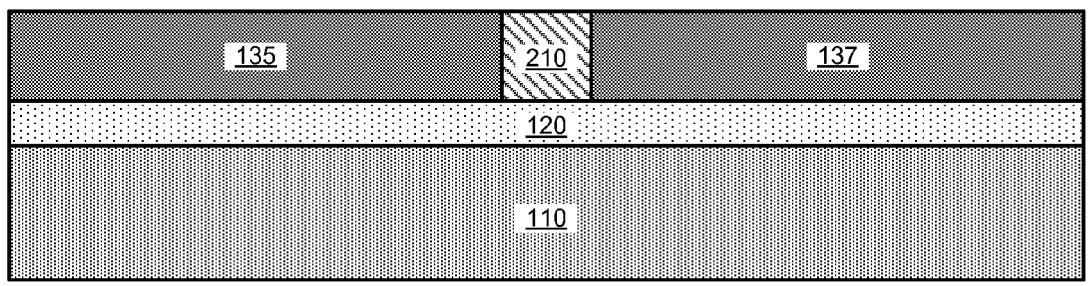
FIG. 2 is a side view depicting forming an isolation region in the SOI layer of the SOI substrate, according to an embodiment of the present invention.

Referring to FIG. 2, an isolation region 210 may be formed in the SOI layer 130, so that the SOI layer 130 is divided into a first SOI portion 135 and a second SOI portion 137. The isolation region 210 may be formed using various methods known in the art. For example, a shallow trench isolation (STI) process may be utilized. In a STI process, a trench may be etched in the SOI layer 130, an insulating layer may be deposited to fill the trench, and the insulating layer is planarized to remove any insulating material from outside the trench (not shown). In other embodiments, the first SOI portion 135 and the second SOI portion 137 may be masked while dopants may be implanted into the isolation region 210 so that the material of the SOI layer 130 in the isolation region 210 is converted from semiconductive to insulating (not shown). The isolation region 210 may also be formed using other suitable methods not explicitly disclosed herein.

Figure 3:
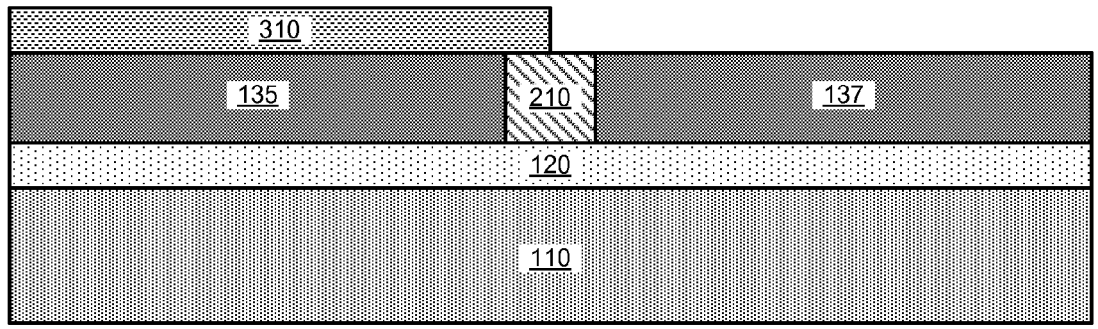
FIG. 3 is a side view depicting masking a first semiconductor region of the SOI layer adjacent to the isolation region, according to an embodiment of the present invention.

Referring to FIG. 3, the first SOI portion 135 may be masked by a masking layer 310. The masking layer 310 may be made of any suitable material capable of protecting the first SOI portion 135 during the subsequent etch and epitaxial growth processes discussed below in conjunction with FIGS. 4-6. Particularly, the masking layer 310 may be heat resistant to withstand high temperatures required of some epitaxial growth processes, as well as being resistant to subsequent processes used to etch the buried insulator layer 120, as described below in conjunction with FIG. 5. In an exemplary embodiment, the masking layer 310 may be made of oxides, nitrides, and oxynitrides of silicon, as well as oxides, nitrides, and oxynitrides of silicon of other elements, and may have a thickness of approximately 10 nm to approximately 10000 nm. In a preferred embodiment, the buried insulator layer 120 may be made of silicon nitride and have a thickness of approximately 50 nm to approximately 500 nm.

Figure 4:
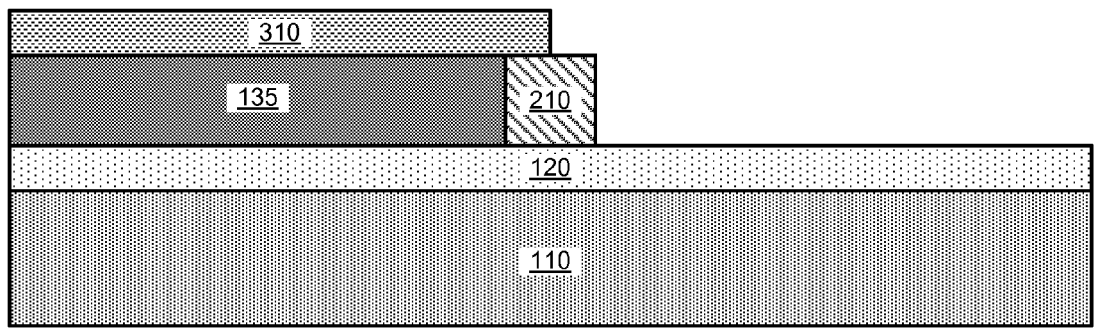
FIG. 4 is a side view depicting removing the unmasked portion of the SOI layer, according to an embodiment of the present invention.

Referring to FIG. 4, the second SOI portion 137 may be removed to form an exposed region of the buried insulator layer 120. The second SOI portion 137 may be removed using any suitable etching technique known in the art, including both wet and dry etching techniques, as well as isotropic and anisotropic etching techniques. In a preferred embodiment, a wet etching technique may be used, for example a potassium hydroxide wet etch or a HNA (hydrofluoric acid, nitric acid, acetic acid) wet etch. Other methods of removing the second SOI portion 137 are known in the art, including, for example, RIE etching and hydrogen chloride gas etching.

Figure 5:
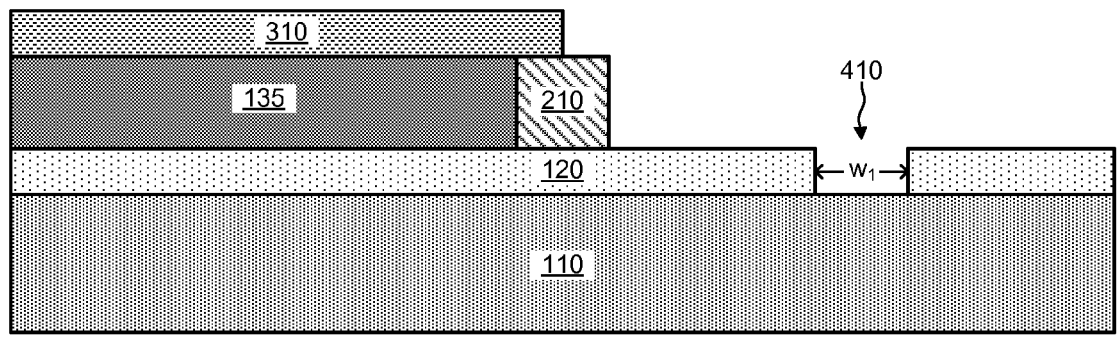
FIG. 5 is a side view depicting forming a hole in the insulating layer of the SOI substrate, according to an embodiment of the present invention.
Figure 6:
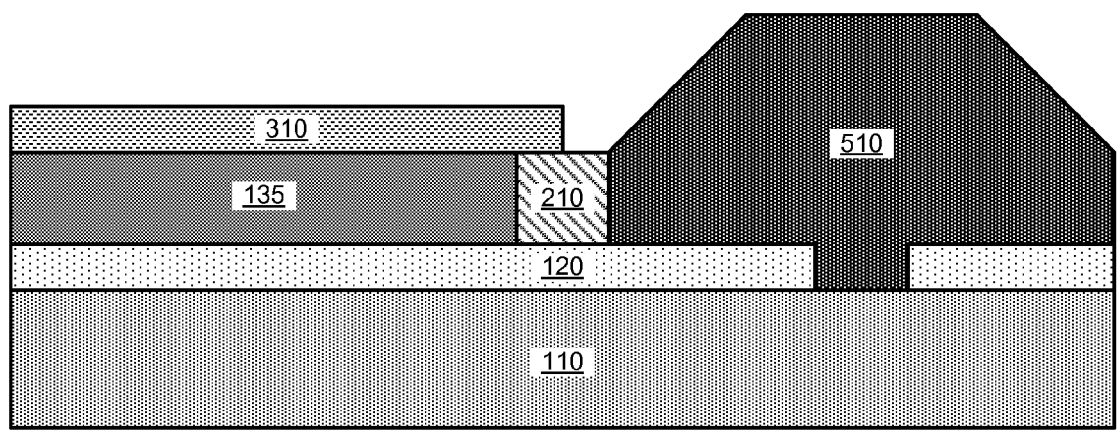
FIG. 6 is a side view depicting growing a second semiconductor region above the insulating layer of the SOI substrate, according to an embodiment of the present invention.

Referring to FIG. 5, a hole 410 may be formed in the buried insulator layer 120 to form an exposed region of the base semiconductor layer 110. The hole 410 may preferably be as small as possible while still allowing the epitaxial growth process detailed below in conjunction with FIG. 6. In an exemplary embodiment, the hole 410 may be approximately round with a diameter $w_1$ of not less than approximately 10 nm. In another embodiment, the hole 410 may be a trench with a width $w_1$ of not less than approximately 10 nm.

The hole 410 may be formed using any typical isotropic etch process, including, for example, RIE or plasma etching. In an exemplary embodiment (not shown), a photoresist layer may be deposited above the buried insulator layer 120, patterned to form a hole in the photoresist layer, so that the hole in the photoresist layer has the same dimensions as desired for the hole 410. The buried insulator layer 120 may then be etched beneath the hole in the photoresist layer. Other typical photolithography and etching techniques may also be utilized, including, for example, forming a planarization layer between the buried insulator layer 120 and the photoresist layer because of the uneven topography (i.e., the height difference between the exposed portion of the buried insulator layer 120 and the first SOI portion 135).

Referring to FIG. 6, a semiconductor layer 510 may be formed above the exposed region of the buried insulator layer 120 by growing an epitaxial semiconductor layer on the exposed region of the base semiconductor layer 110. The semiconductor layer 510 may have a thickness, measured from the top surface of the buried insulator layer 120, at least equal to or greater than the thickness of the first SOI portion 135. The semiconductor layer 510 may be made of any the materials possible for the SOI layer 130, including, for example, known semiconductor materials such as, for example, silicon, germanium, silicon-germanium alloy, carbon-doped silicon, carbon-doped silicon-germanium alloy, and compound (e.g. III-V and II-VI) semiconductor materials. In a preferred embodiment, the material of the semiconductor layer 510 is the same as the material of the base semiconductor layer 110, but different from the first SOI portion 135. In other embodiments, the material of the semiconductor layer 510 may be different from the base semiconductor layer 110. In further embodiments, the material of the semiconductor layer may be the same as the first SOI portion 135. In an exemplary embodiment, the base semiconductor layer 110 and the semiconductor layer 510 may be made of silicon, while the SOI layer 130 may be made of silicon-germanium.

The semiconductor layer 510 may be formed by utilizing any epitaxial growth or deposition process known in the art. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the deposition surface and orient themselves to the crystal arrangement of the atoms of the deposition surface. Therefore, an epitaxial semiconductor layer has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces. Examples of various epitaxial growth process apparatuses that are suitable for use in forming the semiconductor layer 510 include, for example rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

In an exemplary embodiment where the semiconductor layer 510 is made of silicon-germanium, a number of different source gases may be used. In one embodiment, a combination of a silicon source gas and a germanium source gas may be used in forming the layer of silicon germanium alloy. Examples of silicon source gases that may be used include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium source gases that may be used include germane, digermane, halogermane, dichlorogermane, trichlorogermane, tetrachlorogermane and combinations thereof. In some embodiments, a single source gas that includes a silicon component and a germanium component may be used in forming the semiconductor layer 510. Carrier gases like hydrogen, nitrogen, helium and argon may be used during the epitaxial growth process.

In an exemplary embodiment where the semiconductor layer 510 is made of carbon-doped silicon, a carbon source gas may be added the silicon source gas described above. Examples of carbon source gases that may be used in the present application include, for example, alkanes, alkenes, and alkynes.

Figure 7:
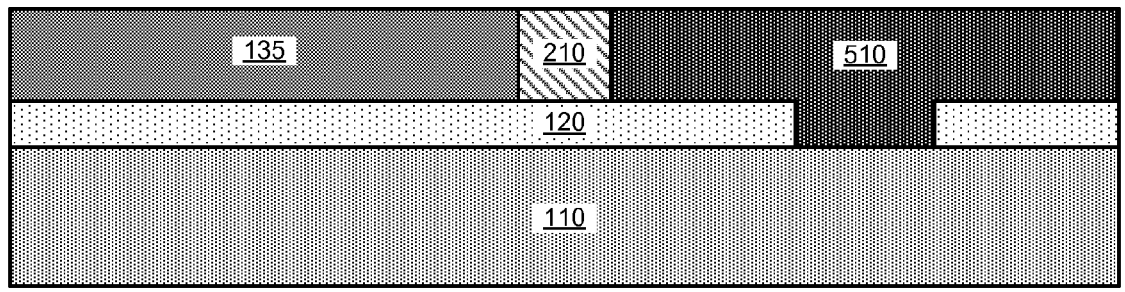
FIG. 7 is a side view depicting planarizing the semiconductor region, according to an embodiment of the present invention.

Referring to FIG. 7, the semiconductor layer 510 may be planarized so that the top surface of the semiconductor layer 510 is approximately coplanar with the top surface of the first SOI portion 135. Any suitable planarization process may be used, including, for example, chemical-mechanical planarization (CMP). To ensure coplanarity, the first SOI portion 135 may be used as a planarization stop layer. After planarization, the semiconductor layer 510 may have substantially the same thickness as the first SOI portion 135

Figure 8:
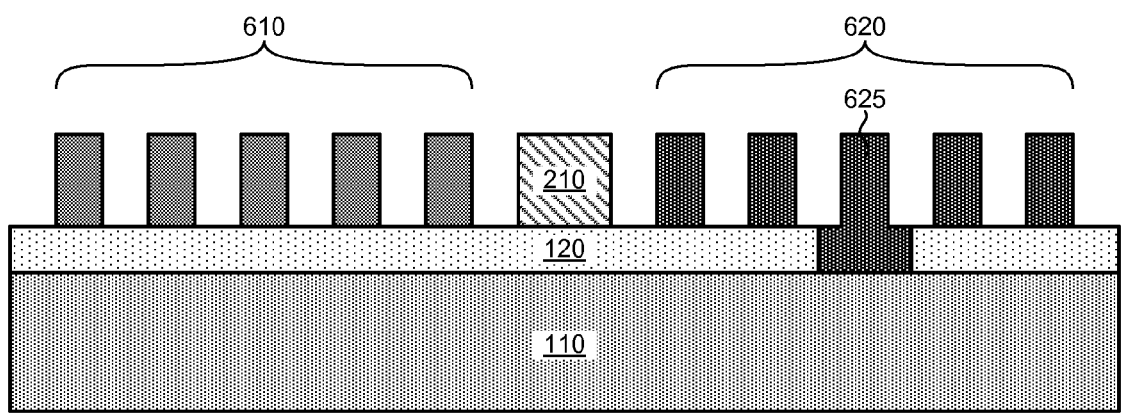
FIG. 8 is a side view depicting forming fins from the first semiconductor region and the second semiconductor region, according to an embodiment of the present invention.

Referring to FIG. 8, a first plurality of fins 610 and a second plurality of fins 620 may be formed from the first SOI portion 135 and the semiconductor layer 510, respectively, so that the first plurality of fins 610 are made of the material of the first SOI portion 135 and the second plurality of fins 620 are made of the material of the semiconductor layer 510. While the first plurality of fins 610 and the second plurality of fins 620 are each depicted as including 5 fins, each may include as few as one fin or more than 5 fins. Each of the first plurality of fins 610 and the second plurality of fins 620 may have a width of approximately 2 nm to approximately 100 nm, preferably approximately 4 nm to approximately 40 nm. Because of planarization process described above in conjunction with FIG. 7, the first plurality of fins 610 and the second plurality of fins 620 may have substantially the same height.

The first plurality of fins 610 and a second plurality of fins 620 may be formed by removing material from the SOI layer 130 (FIGS. 1A-1D) using a photolithography process followed by an anisotropic etching process such as reactive ion etching (RIE) or plasma etching. In other embodiments, the first plurality of fins 610 and a second plurality of fins 620 may be formed by any other process known in the art, including, for example, sidewall image transfer (SIT).

After forming the first plurality of fins 610 and a second plurality of fins 620, further typical semiconductor fabrication processes may performed on the first plurality of fins 610 and a second plurality of fins 620 to form a microelectronic device such as plurality of fin field effect transistors (finFETs). A person of ordinary skill in the art will understand how an SOI substrate including a top semiconductor layer made of a first semiconductor material and a second semiconductor material may be desirable in the fabrication of microelectronic devices other than finFETs.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

The invention claimed is:

1. A method of forming a semiconductor substrate, the method comprising:
    providing a semiconductor-on-insulator (SOI) substrate comprising a base semiconductor layer, a buried insulator layer above the base semiconductor layer, and a SOI layer comprising a first semiconductor material above the buried insulator layer;
    forming an isolation region in the SOI layer isolating a first portion of the SOI layer from a second portion of the SOI layer;
    removing the second portion of the SOI layer to expose a portion of the buried insulator layer;
    forming a hole in the exposed portion of the buried insulator layer to expose a portion of the base semiconductor layer; and
    forming a semiconductor layer comprising a second semiconductor material on the exposed portion of the base semiconductor layer and the exposed region of the buried insulator layer.

2. The method of claim 1, wherein the first semiconductor material is different from the second semiconductor material.

3. The method of claim 1, wherein the first semiconductor material and the second semiconductor material are selected from the group consisting of silicon, silicon-germanium, and carbon-doped silicon.

4. The method of claim 1, wherein forming a semiconductor layer comprising a second semiconductor material comprises epitaxially growing the second semiconductor material on the exposed portion of the base substrate.

5. The method of claim 4, wherein the second semiconductor material comprises the same material as the base semiconductor layer.

6. The method of claim 1, wherein forming a hole in the exposed portion of the buried insulator layer comprises etching a round hole in the buried insulator layer with a diameter of not less than approximately 10 nm.

7. The method of claim 1, wherein forming a hole in the exposed portion of the buried insulator layer comprises etching a trench with a width of not less than 10 nm in the buried insulator layer.

8. The method of claim 1, further comprising:
    etching the first portion of the SOI layer to form a first fin made of the first semiconductor material; and
    etching the semiconductor layer to form a second fin made of the second semiconductor material.

* * * * *